(12) United States Patent
Reynolds

(10) Patent No.: US 7,346,645 B2
(45) Date of Patent: Mar. 18, 2008

(54) ARCHITECTURE FOR TRANSVERSE-FORM ANALOG FINITE-IMPULSE-RESPONSE FILTER

(75) Inventor: Scott Kevin Reynolds, Granite Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 662 days.

(21) Appl. No.: 10/981,820

(22) Filed: Nov. 5, 2004

(65) Prior Publication Data

US 2006/0097777 A1    May 11, 2006

(51) Int. Cl.
*G06G 7/02* (2006.01)
(52) U.S. Cl. ..................................... 708/819
(58) Field of Classification Search ................ 708/819
See application file for complete search history.

(56) References Cited

U.S. PATENT DOCUMENTS

| | | | | |
|---|---|---|---|---|
| 4,661,789 A | * | 4/1987 | Rauscher | 333/202 |
| 5,021,756 A | * | 6/1991 | Tajima et al. | 333/132 |
| 5,563,819 A | * | 10/1996 | Nelson | 708/819 |
| 5,940,441 A | | 8/1999 | Cranford, Jr. et al. | 375/232 |
| 7,142,596 B2 | * | 11/2006 | Pavan | 375/232 |

OTHER PUBLICATIONS

Wu et al., "Integrated Transversal Equalizers in High-Speed Fiber-Optic Systems", IEEE J. Solid-State Circuits, vol. 36, No. 12, Dec. 2003, pp. 2131-2137.
Wu et al., "Differential 4-tap and 7-tap Transverse Filters in SiGe for 10 Gb/s Multimode Fiber Optic Link Equalization", IEEE 2003 Int. Solid-State Circuits Conf. Dig. Tech. Papers, pp. 180-181.
Rauscher, "Microwave Active Filters Based on Transversal and Recursive Principles", IEEE Tran. Microwave Theory Tech., vol. MTT-33, No. 12, Dec. 1985, pp. 1350-1360.
Schindler et al., "A Novel MMIC Active Filter with Lumped and Transversal Elements", IEEE Tran. Microwave Theory Tech., vol. 37, No. 12, Dec. 1989, pp. 2148-2153.
Borjak et al., "High-Speed Generalized Distributed-Amplifier-Based Transversal-Filter Topology for Optical Communication Systems", IEEE Tran. Microwave Theory Tech., vol. 45, No. 8, Aug. 1997, pp. 1453-1457.
Jamani et al., "An Active Transversal Filter MMIC for Very High-Speed Lightwave Systems", IEEE Photon. Tech. Letters, vol. 9, No. 6, Jun. 1997, pp. 836-838.
Montiero et al., "10-Gb/s Pulse Shaping Distributed-Based Transversal Filter Front-End for Optical Soliton Receivers", IEEE Microwave Guided Wave Letters, vol. 8, No. 1, Jan. 1998, pp. 4-6.

(Continued)

*Primary Examiner*—Tan V. Mai
(74) *Attorney, Agent, or Firm*—Duke W. Yee; Thu Ann Dang

(57) ABSTRACT

A transverse form analog finite impulse response filter. The filter has an input and an output. A first set of passive delay elements connected in serial to the input, and a second set of passive delay elements are connected in serial to the output. Transconductors are connected in parallel with the first plurality of passive delay elements and the second plurality of passive delay elements. A set of buffer amplifiers is connected to the passive delay elements in the first set of passive delay elements and in the set of passive delay elements. The buffer amplifiers cause a reduction in loss in the passive delay elements.

20 Claims, 3 Drawing Sheets

OTHER PUBLICATIONS

Lee et al., "MMIC Adaptive Transversal Filtering Using Gilbert Cells and is Suitable for High-Speed Lightwave Systems", IEEE Photon. Tech. Letters, vol. 12, No. 2, Feb. 2000, pp. 196-198.

Yang et al., "A Quad-Channel 3.125 Gb/s/ch Serial-Link Transceiver with Mixed-Mode Adaptive Equalizer in 0.18 μm CMOS", IEEE 2004 Int. Solid-State Circuits Conf. Dig. Tech. Papers, pp. 176-177.

Zhang et al., "A BiCMOS 10Gb/s Adaptive Cable Equalizer", IEEE 2004 Int. Solid-State Circuits Conf. Dig. Tech. Papers, pp. 482-483.

Jutzi, "Microwave Bandwidth Active Transversal Filter Concept with MESFETs", IEEE Tran. Microwave Theory Tech, vol. MTT-19, No. 9, Sep. 1971, pp. 760-767.

* cited by examiner

ARCHITECTURE FOR TRANSVERSE-FORM ANALOG FINITE-IMPULSE-RESPONSE FILTER

BACKGROUND OF THE INVENTION

1. Technical Field

The present invention relates generally to an improved data processing system and in particular to an apparatus for transmitting data over fiber-optic fibers. Still more particularly, the present invention relates to an apparatus for equalizing signals transmitted over fiber-optic cables.

2. Description of Related Art

In fiber-optic data systems using multi-mode fibers (MMFs), inter-symbol interference (ISI) due to modal and chromatic dispersion significantly limits the achievable transmission distance. At a given data rate, ISI must be reduced if transmission distance is to be increased. For example, in 10 Gb/s Ethernet links, it is desired to achieve the same 300 meter distance as in previous generation networks, but the increased data rate makes it difficult to do so unless the optical fiber is upgraded. An economic incentive is present to use lower-cost MMFs and especially to utilize the large installed base of fibers in existing local area networks (LANs), so it is desirable to find a cost-effective way to reduce the ISI.

While the fiber dispersion can be partially compensated by pre-emphasis or coding at the transmitter side of the link, receiver equalization is the most convenient method for dispersion compensation, since any technique used needs to be adaptive due to the temporal variation of the dispersion with laser launch conditions and temperature, as well as variation with fiber length.

The use of continuous-time, transverse-form analog finite-impulse-response filters (often referred to in the literature as "transversal" filters) for optical receiver equalization is well known in the literature. Less complex filters of similar architecture are also used for cable equalization. Due to the high data rates involved, most of these filters are implemented using SiGe BiCMOS or GaAs MESFET technologies.

SUMMARY OF THE INVENTION

When passive delay lines are implemented on an integrated circuit using, for example, lumped inductors (L) and capacitors (C), the low quality-factor (Q) of the LC components results in a lossy delay line. The lossy delay line attenuates the signal at all frequencies, and especially at high frequencies, resulting in poor filter performance. Active delay lines present their own set of problems, including higher power consumption, and the difficulty of achieving adequate signal delays without limiting the bandwidth. All-pass filters, implemented using operational amplifiers or similar active structures, can independently set the signal delay and bandwidth, but depend on a wide bandwidth active device, such as a SiGe bipolar transistor, to realize the amplifier. They also consume high power.

Therefore, it would be advantageous to have a filter in which performance is improved. The present invention provides a transverse-form analog finite-impulse-response filter. The filter has an input and an output. A first set of passive delay elements connected in serial to the input, and a second set of passive delay elements are connected in serial to the output. Transconductors are connected in parallel with the first plurality of passive delay elements and the second plurality of passive delay elements. A set of buffer amplifiers is connected to the passive delay elements in the first set of passive delay elements and in the set of passive delay elements. The buffer amplifiers amplify the signal to compensate for the loss in the passive delay elements and break the delay line into segments whose frequency response and delay can be independently controlled.

BRIEF DESCRIPTION OF THE DRAWINGS

The invention as well as a preferred mode of use, further objectives, and advantages thereof, will best be understood by reference to the following detailed description of an illustrative embodiment when read in conjunction with the accompanying drawings, wherein.

DETAILED DESCRIPTION OF THE PREFERRED EMBODIMENT

Figure 1:
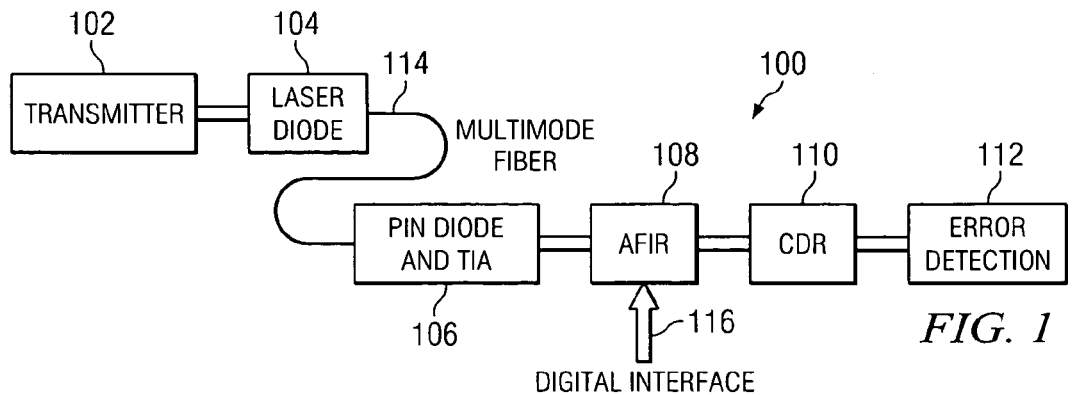
FIG. 1 is a diagram of an optical data system in accordance with an illustrative embodiment.

With reference now to the figures, and in particular, with reference to FIG. 1, a diagram of an optical data system is depicted in accordance with an illustrative embodiment. Optical data system 100 is an example of a fiber optic data system using multi-mode fibers. These fibers are optic fibers that carry data in the form of light. Optical data system 100 includes, transmitter 102, laser diode 104, p-type semiconductor/intrinsic/n-type semiconductor (PIN) diode detector and trans-impedance amplifier (TIA) 106, transverse-form analog finite-impulse-response (AFIR) filter 108, clock-and-data recovery (CDR) circuit 110, and error detection circuit 112. Laser diode 104 is connected to PIN diode detector and TIA 106 by multimode fiber 114 in optical data system 100. Transmitter 102 is a source of data in optical data system 100 and sends data in the form of a modulated electrical signal to laser diode 104. Laser diode 104 sends the data in the form of light signals on multimode fiber 114. These signals are received by a PIN diode that converts them back to electrical signals, and the electrical signals are amplified by TIA 106. The electrical signal from the PIN diode and TIA 106 is applied to AFIR filter 108, which equalizes the received signal to compensate for inter-symbol interference in the system 100. The CDR 110 extracts clocking information from the equalized signal and uses the clocking information to sample the signal at the optimum time to recover the transmitted data. Error detector 112 determines if the data has been received correctly and provides a count of the errors.

In the illustrative embodiment, an improved filter is provided for implementation in transverse-form AFIR filter 108. Current designs for this component are implemented as a separate 0.12-μm CMOS chip with a 1.5 mm by 4.8 mm die area, but is intended for future integration with CDR 110. Using typical tap coefficients, power consumption for AFIR filter 108 is 115 to 130 mA from a 2.5 V supply. These tap code coefficients are controlled through digital interface 116 in AFIR filter 108. The digital control circuits use a 1.2 V supply.

In general, continuous-time AFIR filters are implemented using passive or active delay lines to create delayed versions of the input and/or output signals. The various delayed signals are weighted by applying variable gain and then summed together to create the filter output signal. An improved architecture of the delay lines in a transverse-form AFIR filter, such as transverse-form AFIR filter 108 in FIG. 1, is provided in the illustrative examples.

Figure 2:
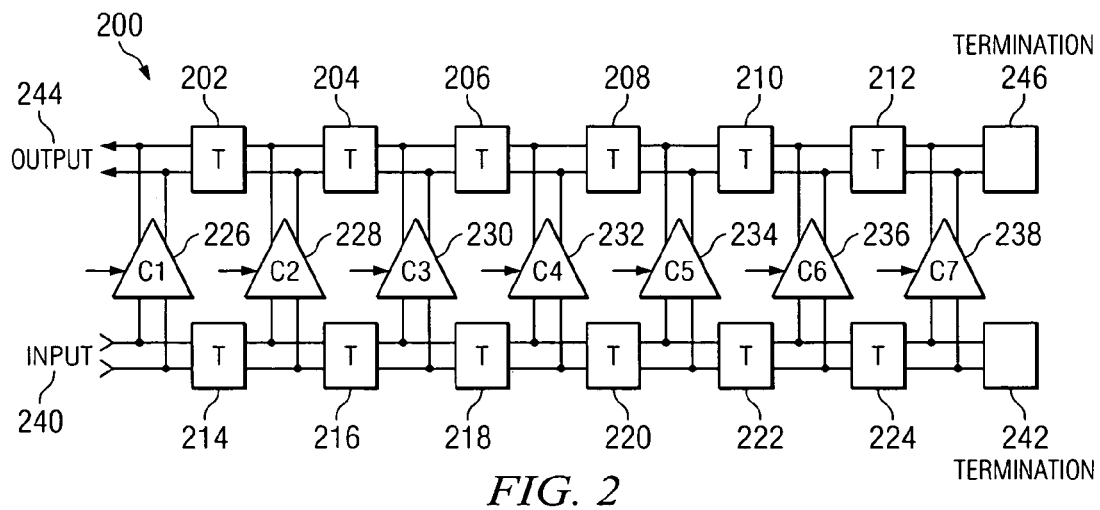
FIG. 2 is a diagram of a 7-tap transverse-form AFIR filter in accordance with an illustrative embodiment.

Turning to FIG. 2, a diagram of a 7-tap transverse-form AFIR filter is depicted in accordance with an illustrative embodiment. In this example, transverse-form AFIR filter 200 includes delay elements 202, 204, 206, 208, 210, 212, 214, 216, 218, 220, 222, and 224. Additionally, transverse-form AFIR filter 200 also includes transconductors 226, 228, 230, 232, 234, 236, and 238. Transverse-form AFIR filter contains input 240, termination 242, output 244, and termination 246.

Delay elements 202, 204, 206, 208, 210, and 212 are located between output 244 and termination 246 to form an output delay line. Delay elements 214, 216, 218, 220, 222, and 224 are located between input 240 and termination 242 to form an input delay line. The input and output delay lines are tapped after each delay element, and the signal at each tap on the input delay line is applied to an input of a transconductor, while the transconductor outputs are summed into the taps on the output delay line. The transconductors contain active devices (bipolar transistors or FETs) and have adjustable transconductance controlled by coefficients C1 to C7. By adjusting coefficients C1 to C7, the gain applied to the signal through each of the taps can be controlled, and the filter output is a summation of the outputs of each of the transconductors, each transconductor output being delayed in time by a different amount by the output delay line.

Figure 3:
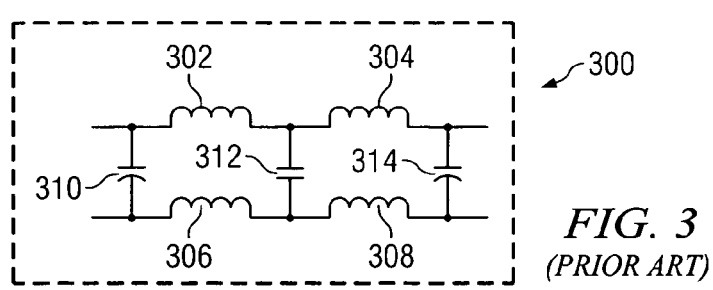
FIG. 3 is a diagram of a known delay element.

Turning to FIG. 3, a diagram of a known delay element is depicted. Delay element 300 is an example of a known delay element that may be implemented within transverse form AFIR filter 200 in FIG. 2 to form a known transverse form AFIR filter system. Delay element 300 contains inductors 302, 304, 306, and 308. This delay element also contains capacitors 310, 312, and 314. Delay element 300 is a passive delay element used to form passive delay lines.

Note that although the delay element 300 shown in FIG. 3 is implemented as an artificial transmission line using lumped inductors (L) and capacitors (C), it could also be implemented using physical on-chip transmission lines constructed with microstrip or stripline structures. Furthermore, although a differential delay element is shown in FIG. 3, the delay elements and other components in FIG. 2 could be single-ended.

When passive delay lines are implemented on an integrated circuit using, for example, lumped inductors (L) and capacitors (C), the low quality-factor (Q) of the LC components results in a lossy delay line. The lossy delay line attenuates the signal at all frequencies, and especially at high frequencies, resulting in poor filter performance. Active delay lines present their own set of problems, including higher power consumption, and the difficulty of achieving adequate signal delays without limiting the bandwidth. All-pass filters, implemented using operational amplifiers or similar active structures, can independently set the signal delay and bandwidth, but depend on a wide bandwidth active device, such as a SiGe bipolar transistor, to realize the amplifier. They also consume high power.

Figure 4:
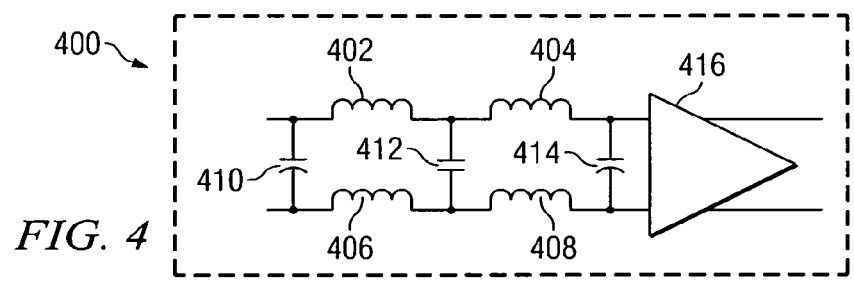
FIG. 4 is an improved delay element in accordance with an illustrative embodiment.

In the illustrative examples, one solution for the lossy passive on-chip delay lines is to insert buffer amplifiers at intervals in the delay line. This creates a hybrid passive/active structure, which can eliminate the signal loss while achieving adequate delays and wide bandwidth. Turning to FIG. 4, an improved delay element is shown in accordance with an illustrative embodiment. Delay element 400 is an active delay element that is found within transverse form AFIR filter 200 in FIG. 2 to form a filter system according to an illustrative embodiment.

Delay element 400 contains inductors 402, 404, 406, and 408. This delay element also contains capacitors 410, 412, and 414. Delay element 400 contains buffer amplifier 416, which is an active element in delay element 400. This buffer amplifier in delay element 400 is used to compensate for the loss in passive delay lines due to the relatively low Q of the passive elements. The use of buffer amplifiers also has the advantage of breaking the delay line into manageable segments whose frequency response and delay can be more accurately controlled over variations in component characteristics. The basic structure of the filter in FIG. 2 is unchanged except for the buffer amplifier addition to the delay elements.

To fulfill its function, the buffer amplifier 416 must properly terminate the delay line consisting of inductors 402, 404, 406, 408 and capacitors 410, 412, 414 such that the delay line has the desired bandwidth and delay. The buffer amplifier 416 must also provide the correct output impedance so that the following delay line has the desired bandwidth and delay. In many cases (but by no means all), the correct input and output impedance will be the characteristic impedance Zo of the artificial transmission line formed by the inductors and capacitors, where Zo=$\sqrt{L/C}$ and L is the inductance value and C is the capacitance value. The buffer amplifier 416 must also have sufficient gain to compensate for the passive delay element loss, and it must have sufficient isolation between input and output to prevent undesired interaction between the delay line segments. Thus there are a variety of active circuits that could be used for or in place of the buffer amplifier 416.

The present invention also recognizes that this improvement over the prior art, the use of buffer amplifiers, has the disadvantage of consuming power, and these buffer amplifiers also add their own delay to the signal. The buffer amplifier delays vary more with variations in temperature and process than the better controlled passive-element delays. Thus, if the buffer amplifier delays make up a significant portion of the total delay in the delay line, performance may be compromised in some cases. The present invention further realizes that, in transverse-form AFIR filter 200, buffers need not be added to every delay element in the input and output delay lines. In the illustrative example, a hybrid delay structure can be created which has a buffer amplifier in every second delay element without compromising the matching between the taps on a multi-tap FIR filter.

Figure 5:
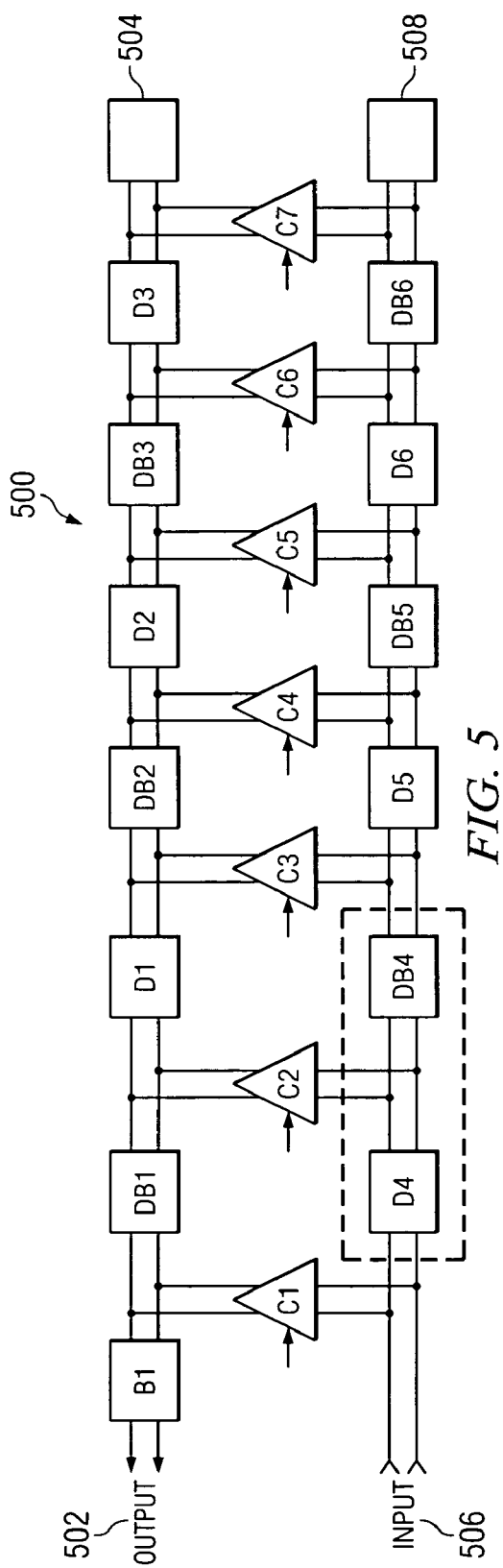
FIG. 5 is a transverse form AFIR filter in accordance with an illustrative embodiment.

With reference to FIG. 5, a transverse form AFIR filter is depicted in accordance with an illustrative embodiment. Transverse form AFIR filter 500 contains an output delay line between output 502 and termination 504 formed by buffer B1, delay element DB1, delay element D1, delay element DB2, delay element D2, delay element DB3, and delay element D3. An input delay line is located between input 506 and termination 508. This delay line contains delay element D4, delay element DB4, delay element D5, delay element DB5, delay element D6, and delay element DB6. Transverse form AFIR filter 500 also contains transconductors T1, T2, T3, T4, T5, T6, and T7. These transconductors have adjustable transconductance controlled by coefficients C1 to C7. Delay elements D1, D2, D3, D4, D5, and D6 are passive delay elements. Delay elements DB1, DB2, DB3, DB4, DB5, and DB6 are active delay elements containing buffer amplifiers. As can be seen, a buffer amplifier is included only in every other delay element in the input and output delay lines in this illustrative embodiment. Delay element D4 and delay element DB4 form a delay unit, which also is called a hybrid delay structure.

In transverse form AFIR filter 500, since the incremental delay of each tap consists of one delay element with a buffer and one delay element without a buffer, the matching of tap delays is unaffected if the delay of the delay elements with a buffer does not match the delay of the delay elements without a buffer. Thus, half the buffers can be eliminated, which cuts power consumption due to the buffers in half, and actually improves the performance of the filter because the buffer amplifier delays now make up a smaller fraction of the total delay in the line.

Figure 6:
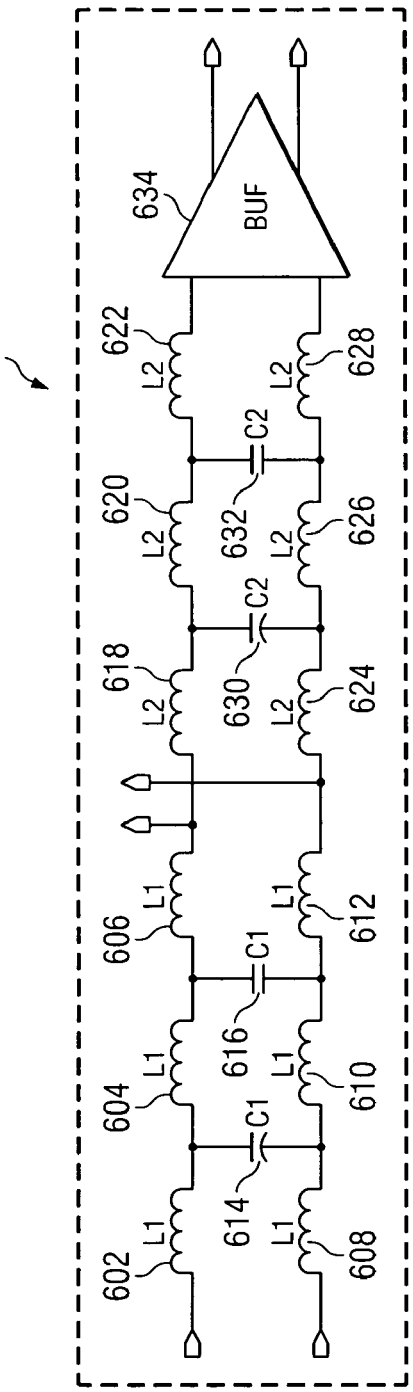
FIG. 6 is a diagram of two delay elements in accordance with an illustrative embodiment.

Turning now to FIG. 6, a diagram of two delay elements is depicted in accordance with an illustrative embodiment. Delay unit 600 contains two delay elements, such as delay element D4, and delay element DB4 in FIG. 5. Inductors 602, 604, 606, 608, 610, and 612 along with capacitors 614 and 616 form a passive delay element, such as delay element D4 in FIG. 5. Inductors 618, 620, 622, 624, 626, and 628 along with capacitor 630, capacitor 632, and buffer amplifier 634 forms an active delay element, such as delay element DB4 in FIG. 5.

In the active delay elements containing buffer amplifiers, the delay of the passive LC components is reduced to compensate for the insertion delay of the buffer and match the approximate 39 ps delay of the entirely passive elements. Note that even if the D and DB delay elements mismatch, the matching of tap delays is unaffected, since the incremental delay of each tap consists of one D and one DB element. As compared to the illustrative embodiment in FIG. 2 using delay elements from FIG. 4, half of the buffer amplifiers have been eliminated with no adverse effect. Thus, power usage is reduced and the fraction of the total delay in the lines due to buffers is also reduced. The reduction in the fraction of the total delay due to the buffers provides improved stability of the total delay over variations in process and temperature. Eliminating more buffers, such as having a buffer amplifier every third or fourth delay element, may be performed in other illustrative embodiments. This additional elimination of buffer amplifiers, however, may in some case compromise the matching of tap delays.

Figure 7:
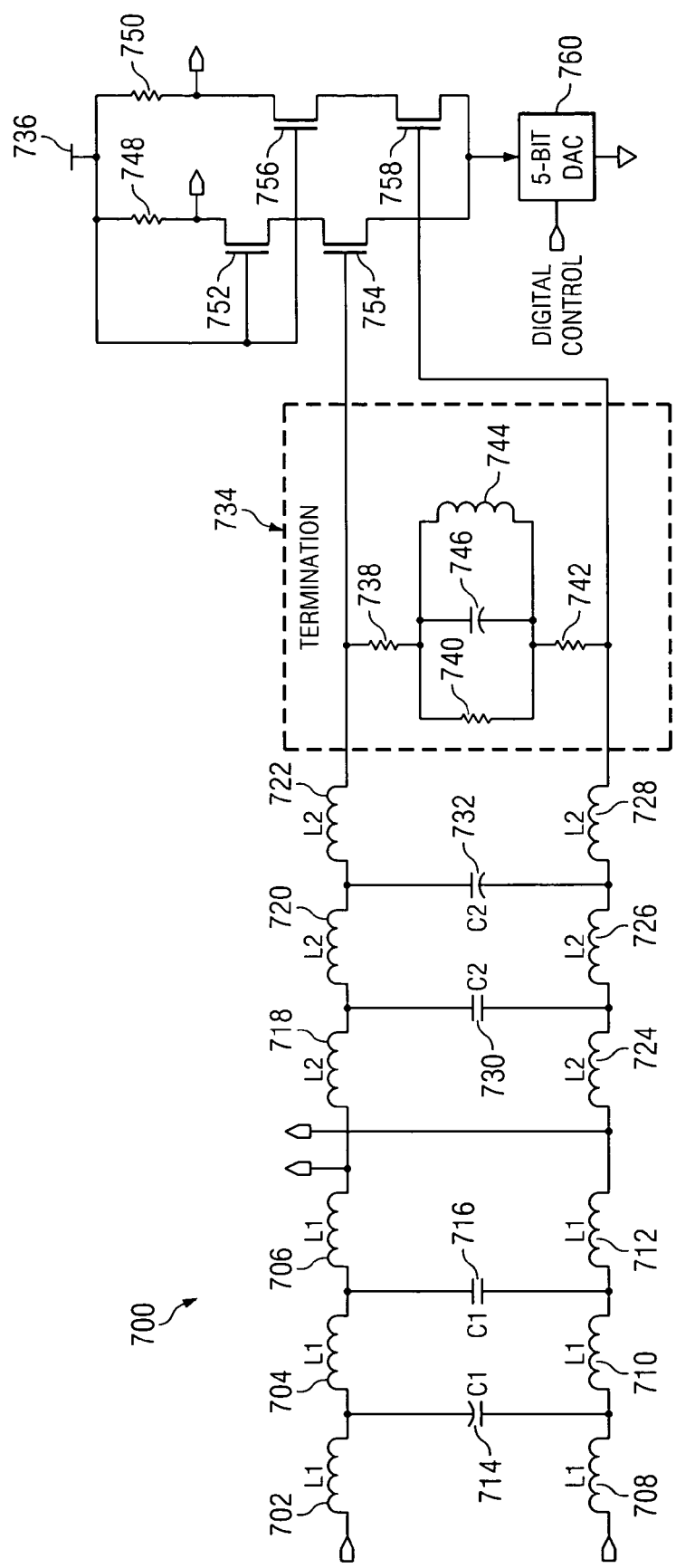
FIG. 7 is a more detailed illustration of a delay element according to an illustrative embodiment.

Turning now to FIG. 7, a more detailed illustration of a delay element is depicted according to an illustrative embodiment. Delay unit 700 is a more detailed illustration of delay unit 600 in FIG. 6. This delay unit is equivalent to one D and one DB delay element, such as delay element D4, and delay element DB4 from FIG. 5.

Delay unit 700 contains inductors 702, 704, 706, 708, 710, and 712 along with capacitor 714 and 716 to form a passive delay element, such as delay element D4 in FIG. 5. Inductors 718, 720, 722, 724, 726, and 728 along with capacitors 730 and 732 are part of an active delay element, such as delay element DB4 in FIG. 5. In addition, this active delay element also includes termination circuit 734 connected to buffer amplifier 736. Termination circuit 734 contains resistor 738, resistor 740, resistor 742, inductor 744, and capacitor 746. Buffer amplifier 736 contains resistor 748, resistor 750, transistor 752, transistor 754, transistor 756, transistor 758, and digital to analog control (DAC) unit 760. The complex termination shown in FIG. 7 is added for response peaking to extend the bandwidth of the system and is an example of the additional design flexibility gained by adding buffer amplifiers in the illustrative embodiments.

Thus, the illustrative embodiments show an improved architecture for a transverse-form AFIR filter in which performance in equalization is improved such that signal loss is eliminated while achieving desired delay times and bandwidth. These performance increases result from the use of active elements in the delay lines. In these illustrative examples, the filter may be implemented using a cost-effective complimentary metal oxide semiconductor (CMOS) technology, rather than more expensive technologies used in other known filters.

The description of the present invention has been presented for purposes of illustration and description, and is not intended to be exhaustive or limited to the invention in the form disclosed. Many modifications and variations will be apparent to those of ordinary skill in the art. For example, the mechanism in the illustrative embodiments also may be used for cable equalization. The embodiment was chosen and described in order to best explain the principles of the invention, the practical application, and to enable others of ordinary skill in the art to understand the invention for various embodiments with various modifications as are suited to the particular use contemplated.

What is claimed is:

1. A transverse-form analog finite-impulse-response filter comprising:
    an input;
    an output;
    a first plurality of passive delay elements connected in serial to the input;
    a second plurality of passive delay elements connected in serial to the output;
    a plurality of transconductors connected in parallel with the first plurality of passive delay elements and the second plurality of passive delay elements; and
    a set of buffer amplifiers connected to the passive delay elements in the first plurality of passive delay elements and in the second plurality of passive delay elements.

2. The transverse-form analog finite-impulse-response filter of claim 1, wherein a buffer amplifier in the set of buffer amplifiers is connected to each passive delay element in the first plurality of passive delay elements and the in the second plurality of passive delay elements.

3. The transverse form analog finite impulse response filter of claim 1, wherein a buffer amplifier in the set of buffer amplifiers is connected to every other passive delay element in the first plurality of passive delay elements and in the second plurality of passive delay elements.

4. The transverse form analog finite impulse response filter of claim 1, wherein, the transverse analog finite-impulse-response filter is implemented entirely on an integrated circuit.

5. The transverse form analog finite impulse response filter of claim 4, wherein the integrated circuit is a complementary metal oxide semiconductor integrated circuit.

6. The transverse form analog finite impulse response filter of claim 1, wherein the transverse analog finite-impulse-response filter is integrated with the clock and data recovery circuit on an integrated circuit.

7. The transverse form analog finite impulse response filter of claim 1, wherein each delay element in the first plurality of passive delay elements and in the second plurality of passive delay elements includes passive delay lines.

8. The transverse form analog finite impulse response filter of claim 1, wherein each delay element in the first plurality of passive delay elements and the in the second plurality of passive delay elements includes a plurality of inductors and a plurality of capacitors.

9. The transverse form analog finite impulse response filter of claim 1, wherein the plurality of transconductors is a plurality of active devices.

10. The transverse form analog finite impulse response filter of claim 1, wherein the active devices includes at least one of bipolar transistors and field effect transistors.

11. The transverse form analog finite impulse response filter of claim 1, wherein transconductors are coefficient controlled.

12. The transverse form analog finite impulse response filter of claim 1, wherein the plurality of transconductors are connected using taps from the first plurality of delay elements and the second plurality of delay elements.

13. A fiber optic data system comprising:
a transmitter;
a laser diode connected to the transmitter, wherein the diode generates light signals in response to receiving electrical signals from the transmitter;
a pin diode detector and trans-impedance amplifier connected to output of the laser diode by a light carrying fiber;
a clock and data recovery circuit; and
a transverse analog finite-impulse-response filter connecting the pin diode detector and trans-impedance amplifier to the clock and data recovery circuit, wherein the transverse analog finite-impulse-response filter includes:
a set of passive delay elements connected in series;
a plurality of transconductors connected in parallel with the set of passive delay elements; and
a number of buffer amplifiers inserted within the set of passive delay elements.

14. The fiber optic data system of claim 13, wherein a buffer amplifier follows each passive delay element within the set of passive delay elements.

15. The fiber optic data system of claim 13, wherein a buffer amplifier follows every other passive delay element within the set of passive delay elements.

16. The fiber optic data system of claim 13, wherein the transverse analog finite-impulse-response filter is implemented entirely on an integrated circuit.

17. The fiber optic data system of claim 16, wherein the integrated circuit is a complementary metal oxide semiconductor integrated circuit.

18. The fiber optic data system of claim 13, wherein the transverse analog finite-impulse-response filter is integrated with the clock and data recovery circuit on an integrated circuit.

19. The fiber optic data system of claim 13, wherein each passive delay element within the set of passive delay elements includes passive delay lines.

20. The fiber optic data system of claim 13, wherein each passive delay element includes a plurality of inductors and a plurality of capacitors.

* * * * *